(12) United States Patent
Kim et al.

(10) Patent No.: US 11,469,314 B1
(45) Date of Patent: Oct. 11, 2022

(54) RECONFIGURABLE LOGIC-IN-MEMORY DEVICE USING SILICON TRANSISTOR

(71) Applicant: Korea University Research and Business Foundation, Seoul (KR)

(72) Inventors: Sang Sig Kim, Seoul (KR); Kyoung Ah Cho, Seoul (KR); Doo Hyeok Lim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/412,485

(22) Filed: Aug. 26, 2021

(30) Foreign Application Priority Data

Aug. 4, 2021 (KR) .......................... 10-2021-0102728

(51) Int. Cl.
*H01L 29/68* (2006.01)
*H03K 19/1776* (2020.01)

(52) U.S. Cl.
CPC ....... *H01L 29/685* (2013.01); *H03K 19/1776* (2013.01)

(58) Field of Classification Search
None
See application file for complete search history.

(56) References Cited

U.S. PATENT DOCUMENTS

2018/0138200 A1\* 5/2018 Kim ...................... H01L 29/749
2020/0075094 A1\* 3/2020 Kim .................. H01L 29/42312

FOREIGN PATENT DOCUMENTS

| KR | 10-1438773 B1 | 9/2014 |
| KR | 10-1857873 B1 | 6/2018 |
| KR | 10-1919148 B1 | 11/2018 |
| KR | 10-2125166 B1 | 7/2020 |

\* cited by examiner

*Primary Examiner* — Anh Q Tran
(74) *Attorney, Agent, or Firm* — NSIP Law

(57) ABSTRACT

The present disclosure relates to a reconfigurable logic-in-memory device using a silicon transistor, according to the embodiment of the present disclosure, the reconfigurable logic-in-memory device using a silicon transistor comprises the silicon transistor including a drain region, a first channel region, a second channel region, a source region, and a gate region, wherein the silicon transistor performs a first channel operation while forming a first positive feedback loop in which an electron is a majority carrier in the first channel region and the second channel region depending on a level of a gate voltage $V_{in}$ applied through the gate region or performs a second channel operation while forming a second positive feedback loop in which a hole is a majority carrier in the first channel region and the second channel region depending on the level of a gate voltage $V_{in}$ applied through the gate region.

14 Claims, 19 Drawing Sheets

700

RECONFIGURABLE LOGIC-IN-MEMORY DEVICE USING SILICON TRANSISTOR

CROSS-REFERENCE TO RELATED APPLICATION

This application claims priority to and the benefit of Korean Patent Application No. 10-2021-0102728, filed on Aug. 4, 2021, the disclosure of which is incorporated herein by reference in its entirety.

BACKGROUND OF THE INVENTION

1. Field of the Invention

The present disclosure relates to a reconfigurable logic-in-memory device using a silicon transistor, and more particularly to a reconfigurable logic-in-memory device for performing both a reconfigurable logic operation function and a memory function that are controlled according to an electrical signal.

2. Description of the Related Art

In an existing von Neumann-based computer system, a processor and a memory are separated, and data is transmitted through a bus.

However, with an increase in computing power, a bottleneck occurs due to a difference in data processing speed between the processor and the memory, and there is a limit in processing large amounts of data.

In other words, a von Neumann-based system that is revolutionarily developed in the semiconductor industry has improved the integration density and performance of a modern computer, but has a disadvantage of consuming a lot of energy and increasing data transfer and latency due to physical separation between the processor and the memory hierarchy.

In consideration of rise of data-intensive applications such as 5G communication standards, Internet of Things (IoT), and artificial intelligence (AI) since the 4$^{th}$ industrial revolution, a new computing paradigm is required for large-scale data processing.

To overcome the above problem, research on logic-in-memory (LIM) technology that converges an arithmetic function and a memory function is focused and accelerates.

In other words, as computer performance increases, there is a limit in processing a large amount of data, and to overcome the problem, research has been conducted into package on package (POP) as a one-chip logic memory and through silicon via (TSV) technologies.

Because logic-in-memory technology performs a computing function of a processor and a storage function of the memory in the same space, it is possible to reduce delay time and power consumption during data transmission and to significantly improve system integration.

However, as logic and memory functions are not implemented in a transistor, problems with a bottleneck, power consumption, computational efficiency, and integration still exist.

Conventionally, a circuit including a reconfigurable transistor using a Schottky barrier is capable of performing various logic operations according to an electrical signal.

However, the conventional reconfigurable transistor is not capable of utilizing an existing complementary metal-oxide semiconductor (CMOS) process.

In particular, since the conventional reconfigurable transistor does not have a memory function itself, a signal needs to be transmitted to the memory through a bus.

Therefore, there is a need to develop a reconfigurable logic-in memory device utilizing a CMOS process and using a silicon transistor having reconfigurable switching characteristics and memory characteristics.

[Cited Reference]
[Patent Document]
Korean Patent Publication No. 10-1438773, "Magnetic Field Control Reconfigurable Nori Element and Control Method thereof"
Korean Patent Publication No. 10-1857873, "Logic Semiconductor Device"
Korean Patent Publication No. 10-1919148, "Device Characteristics Control-type Field Effect Thin Film Transistor and Method of Manufacturing the Same"
Korean Patent Publication No. 10-2125166, "Logic gate based on magnetic tunnel junction structure"

SUMMARY OF THE INVENTION

Therefore, the present disclosure has been made in view of the above problems, and it is an object of the present disclosure to provide a reconfigurable logic-in-memory device for performing both a reconfigurable logic operation function and a memory function that are controlled according to an electrical signal using a silicon transistor.

It is another object of the present disclosure to provide a reconfigurable logic-in-memory device using a silicon transistor having reconfigurable switching characteristics and memory characteristics using which it is possible to use a complementary metal-oxide semiconductor (CMOS) process.

It is another object of the present disclosure to provide a reconfigurable logic-in-memory device using a silicon transistor for overcoming a limit in processing speed and integration due to separation of a memory and a processor.

It is yet another object of the present disclosure to provide a reconfigurable logic-in-memory device using a silicon transistor for increasing operational efficiency with low power consumption through excellent switching characteristics while reducing standby power using excellent memory characteristics of the silicon transistor.

In accordance with an aspect of the present disclosure, the above and other objects can be accomplished by the provision of a reconfigurable logic-in-memory device using a silicon transistor, including: a silicon transistor including a drain region, a first channel region, a second channel region, a source region, and a gate region, wherein the silicon transistor performs a first channel operation while forming a first positive feedback loop in which an electron is a majority carrier in the first channel region and the second channel region depending on a level of a gate voltage $V_{in}$ applied through the gate region or performs a second channel operation while forming a second positive feedback loop in which a hole is a majority carrier in the first channel region and the second channel region depending on the level of a gate voltage $V_{in}$ applied through the gate region; and the silicon transistor performs a logic operation function and a memory function based on a level of an output voltage $V_{out}$, which is changed depending on a type of a drain voltage $V_{dd}$ applied through the drain region based on any one channel operation of the first channel operation and the second channel operation.

When the level of the gate voltage $V_{in}$ is a high level, the silicon transistor may perform the first channel operation while forming the first positive feedback loop by preventing a hole from being injected from the drain region as a potential barrier in the first channel region is increased.

When the silicon transistor performs the first channel operation, the reconfigurable logic-in-memory device may perform the logic operation function with a first logic gate based on the level of the output voltage $V_{out}$ as the output voltage $V_{out}$ is output at a high level when the type of the drain voltage $V_{dd}$ is an input voltage in a high state and the output voltage $V_{out}$ is output at a zero level when the type of the drain voltage $V_{dd}$ is an input state in a low state.

When the silicon transistor performs any one of the first channel operation and the second channel operation, the reconfigurable logic-in-memory device may perform the memory function for conversion into an initial state to output a level of the output voltage $V_{out}$, to which a logic operation state pre-determined by the input voltage is applied, when the type of the drain voltage $V_{dd}$ is a read operating voltage and to output the level of the output voltage $V_{out}$, to which the pre-determined logic operation state is applied, at a zero level when the type of the drain voltage $V_{dd}$ is a reset operating voltage.

When the level of the gate voltage $V_{in}$ is a low level, the silicon transistor may perform the second channel operation while forming the second positive feedback loop as a hole is injected from the drain region while a potential barrier in the first channel region is reduced.

When the silicon transistor performs the second channel operation, the reconfigurable logic-in-memory device may perform the logic operation function with a second logic gate based on the level of the output voltage $V_{out}$ as the output voltage $V_{out}$ is output at a zero level when the type of the drain voltage $V_{dd}$ is an input voltage in a high state and the output voltage $V_{out}$ is output at a high level when the type of the drain voltage $V_{dd}$ is an input voltage in a low state.

The drain region and the second channel region may be in a p-doped state; and the source region and the first channel region may be in an n-doped state.

In accordance with another aspect of the present disclosure, there is provided a reconfigurable logic-in-memory device using a silicon transistor, including: a first silicon transistor including a drain region, a first channel region, a second channel region, a source region, and a gate region; and a second silicon transistor including a drain region, a first channel region, a second channel region, a source region, and a gate region and connected in parallel to the first silicon transistor, wherein each of the first silicon transistor and the second silicon transistor performs a first channel operation while forming a first positive feedback loop in which an electron is a majority carrier in the first channel region and the second channel region depending on a level of a gate voltage $V_{in}$ applied through the gate region or performs a second channel operation while forming a second positive feedback loop in which a hole is a majority carrier in the first channel region and the second channel region depending on the level of a gate voltage $V_{in}$ applied through the gate region; and each of the first silicon transistor and the second silicon transistor performs a logic operation function and a memory function based on a level of an output voltage $V_{out}$, which is changed depending on a type of a drain voltage $V_{dd}$ applied through the drain region based on any one channel operation of the first channel operation and the second channel operation.

When the level of the gate voltage $V_{in}$ is a high level, each of the first silicon transistor and the second silicon transistor may perform the first channel operation while forming the first positive feedback loop by preventing a hole from being injected from the drain region as a potential barrier in the first channel region is increased.

When each of the first silicon transistor and the second silicon transistor performs the first channel operation, the reconfigurable logic-in-memory device may perform the logic operation function with a third logic gate based on the level of the output voltage $V_{out}$ as the output voltage $V_{out}$ is output at a zero level when the type of the drain voltage $V_{dd}$ of the first silicon transistor is an input voltage in a low state and the type of the drain voltage $V_{dd}$ of the second silicon transistor is an input voltage in a low state, the output voltage $V_{out}$ is output at a high level when the type of the drain voltage $V_{dd}$ of the first silicon transistor is an input voltage in a high state and the type of the drain voltage $V_{dd}$ of the second silicon transistor is an input voltage in a low state, the output voltage $V_{out}$ is output at a high level when the type of the drain voltage $V_{dd}$ of the first silicon transistor is an input voltage in a low state and the type of the drain voltage $V_{dd}$ of the second silicon transistor is an input voltage in a high state, and the output voltage $V_{out}$ is output at a high level when the type of the drain voltage $V_{dd}$ of the first silicon transistor is an input voltage in a high state and the type of the drain voltage $V_{dd}$ of the second silicon transistor is an input voltage in a high state.

When each of the first silicon transistor and the second silicon transistor equally performs any one of the first channel operation and the second channel operation, the reconfigurable logic-in-memory device may perform the memory function for conversion into an initial state to output a level of the output voltage $V_{out}$, to which a logic operation state pre-determined by the input voltage is applied, when the type of the drain voltage $V_{dd}$ is a read operating voltage and to output the level of the output voltage $V_{out}$, to which the pre-determined logic operation state is applied, at a zero level when the type of the drain voltage $V_{dd}$ is a reset operating voltage.

When the level of the gate voltage $V_{in}$ is a low level, each of the first and second silicon transistors may perform the second channel operation while forming the second positive feedback loop as a hole is injected from the drain region while a potential barrier in the first channel region is reduced.

When each of the first silicon transistor and the second silicon transistor performs the second channel operation, the reconfigurable logic-in-memory device may perform the logic operation function with a fourth logic gate based on the level of the output voltage $V_{out}$ as the output voltage $V_{out}$ is output at a high level when the type of the drain voltage $V_{dd}$ of the first silicon transistor is an input voltage in a low state and the type of the drain voltage $V_{dd}$ of the second silicon transistor is an input voltage in a low state, the output voltage $V_{out}$ is output at a high level when the type of the drain voltage $V_{dd}$ of the first silicon transistor is an input voltage in a high state and the type of the drain voltage $V_{dd}$ of the second silicon transistor is an input voltage in a low state, the output voltage $V_{out}$ is output at a high level when the type of the drain voltage $V_{dd}$ of the first silicon transistor is an input voltage in a low state and the type of the drain voltage $V_{dd}$ of the second silicon transistor is an input voltage in a high state, and the output voltage $V_{out}$ is output at a zero level when the type of the drain voltage $V_{dd}$ of the first silicon transistor is an input voltage in a high state and the type of the drain voltage $V_{dd}$ of the second silicon transistor is an input voltage in a high state.

In each of the first silicon transistor and the second silicon transistor, the drain region and the second channel region may be in a p-doped state; and the source region and the first channel region may be in an n-doped state.

BRIEF DESCRIPTION OF THE DRAWINGS

The above and other objects, features and other advantages of the present disclosure will be more clearly understood from the following detailed description taken in conjunction with the accompanying drawings, in which.

Figure 1A:
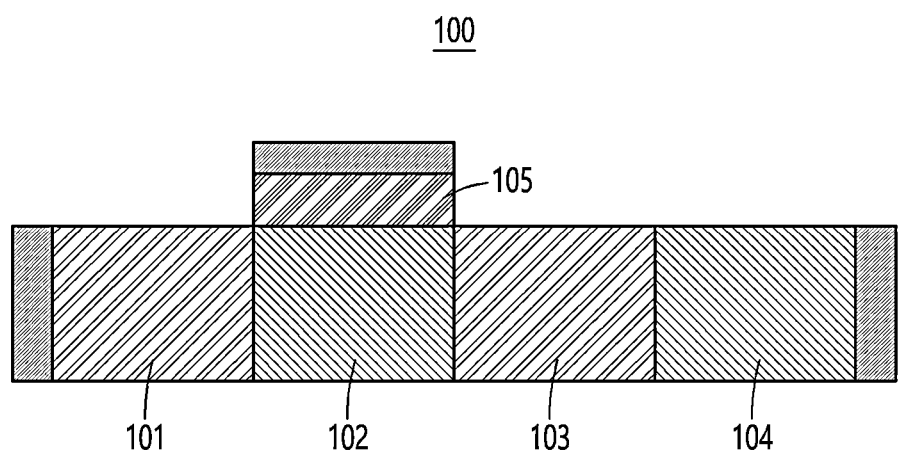
FIGS. 1A and 1B are diagrams for explaining a silicon transistor used in a reconfigurable logic-in-memory according to an embodiment of the present disclosure.

DETAILED DESCRIPTION OF THE DISCLOSURE The present disclosure will now be described more fully with reference to the accompanying drawings, in which exemplary embodiments of the disclosure are shown.

This disclosure, however, should not be construed as limited to the exemplary embodiments and terms used in the exemplary embodiments, and should be understood as including various modifications, equivalents, and substituents of the exemplary embodiments.

Preferred embodiments of the present disclosure are now described more fully with reference to the accompanying drawings. In the description of embodiments of the present disclosure, certain detailed explanations of related known functions or constructions are omitted when it is deemed that they may unnecessarily obscure the essence of the disclosure.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression ". . . configured to . . . (or set to)" may be used interchangeably, for example, with expressions, such as ". . . suitable for . . . ," ". . . having ability to . . . ," " ". . . modified to . . . ," "manufactured to . . . ," ". . . enabling to . . . ," or ". . . designed to . . . ," in the case of hardware or software depending upon situations.

In any situation, the expression "a device configured to . . . " may refer to a device configured to operate "with another device or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or".

That is, unless otherwise mentioned or clearly inferred from context, the expression "x uses a or b" means any one of natural inclusive permutations.

Hereinafter, the terms, such as 'unit' or 'module', etc., should be understood as a unit that processes at least one function or operation and that may be embodied in a hardware manner, a software manner, or a combination of the hardware manner and the software manner.

Figure 1B:
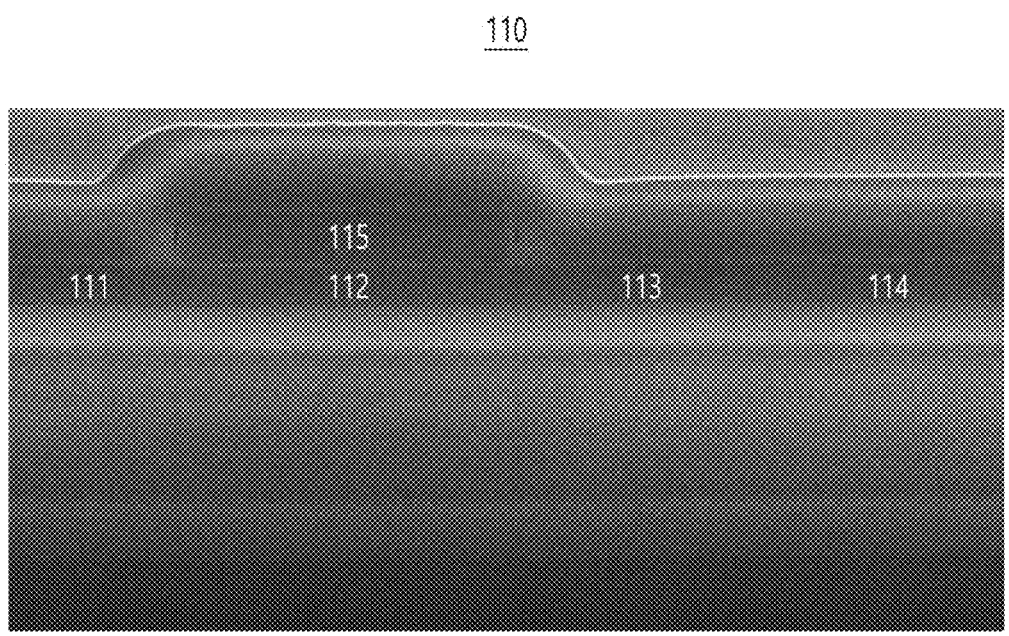

FIGS. 1A and 1B are diagrams for explaining a silicon transistor used in a reconfigurable logic-in-memory according to an embodiment of the present disclosure.

FIG. 1A is a block diagram of a silicon transistor used in a reconfigurable logic-in-memory device according to an embodiment of the present disclosure.

Referring to FIG. 1A, a silicon transistor 100 according to an embodiment of the present disclosure may include a drain region 101, a first channel region 102, a second channel region 103, a source region 104, and a gate region 105.

For example, a drain electrode may be formed in the drain region 101, a source electrode may be formed in the source region 104, and a gate electrode may be formed in the gate region 105.

According to an embodiment of the present disclosure, the drain region 101 and the second channel region 103 may be in a p-doped state, and the first channel region 102 and the source region 104 may be in an n-doped state.

For example, the drain region 101, the first channel region 102, the second channel region 103, and the source region 104 may form a p-n-p-n diode structure.

The silicon transistor 100 according to an embodiment of the present disclosure may be a feedback field effect transistor for variably performing a p-channel operation and an n-channel operation in a single device by forming the polysilicon gate region 105 and forming a potential barrier using gate modulation in a p-n-p-n diode structure.

For example, the silicon transistor 100 may include a gated p-n-p-n diode structure, and therein, a latch-up phenomenon and a latch-down phenomenon occur through a feedback operation mechanism of electrons and holes.

The silicon transistor 100 may be turned on by the latch-up phenomenon and may be turned off by the latch-down phenomenon using a positive feedback loop.

The silicon transistor according to an embodiment of the present disclosure may have reconfigurable switching characteristics whereby a p-channel and an n-channel are operable in a transistor as a positive feedback loop is formed by adjusting the height of a potential barrier. Here, the reconfigurable switching characteristics may correspond to characteristics whereby it is possible to variably perform a p-channel operation and an n-channel operation.

For example, in a channel region, an operation of a p-channel in a transistor may be referred to as a p-channel operation, and an operation of an n-channel in a transistor may be referred to as an n-channel operation.

The silicon transistor according to an embodiment may have memory characteristics as holes or electrons are accumulated in a potential well using a positive feedback loop.

That is, the silicon transistor 100 may perform a first channel operation or a second channel operation depending on a level of a gate voltage applied through the gate region 105.

The silicon transistor 100 may perform a memory function depending on a type of a drain voltage applied through the drain region 101 based on any one channel operation of a first channel operation and a second channel operation which are related to an operating state of the first channel region 102 and an operating state of the second channel region 103.

Here, the type of the drain voltage may include a read operating voltage, a standby operating voltage, and a reset operating voltage.

The silicon transistor 100 according to an embodiment of the present disclosure may be referred to as a feedback field effect transistor and may have switching characteristics due to a feedback phenomenon that occurs by electrons and holes inside a channel region including the first channel region 102 and the second channel region 103.

The silicon transistor 100 may be operated by forming a potential barrier that restricts inflow of electrons and holes in the channel region and controlling the barrier.

The silicon transistor 100 may use a method of injecting electrons and holes into each spacer according to a high voltage programming condition and forming a potential barrier of the channel region as such.

However, a structure having a spacer has disadvantages in that it is not possible to achieve stable device characteristics because a transistor device needs to experience a programming condition before being operated, an additional process is needed in addition to existing processes, and a spacer region is unstable due to repetitive device operations.

To overcome this, a structure in which an existing spacer is replaced with an additional electrode or a highly doped region is formed in a channel region is utilized.

In the silicon transistor 100 according to an embodiment of the present disclosure, the first channel region 102 may be n-doped and the second channel region 103 may be p-doped and may operate as an n-channel or a p-channel depending on a voltage applied thorough the gate region 105. Here, the n-channel operation may be referred to as a first channel operation and a p-channel operation may be referred to as a second channel operation.

For example, the electrical properties of the silicon transistor 100 may be dependent upon the state of a potential barrier formed in the channel region.

Thus, the electrical properties may be changed depending on a factor such as the length and thickness of the channel region, the type and thickness of a gate insulator, and a voltage applied to the channel region, which may affect the state of the potential barrier.

In the silicon transistor 100 according to an embodiment of the present disclosure, when a positive voltage is applied to the first channel region 102 through the gate region 105 in an off-state in which a potential barrier that blocks electrons introduced from the drain region 101 and a potential barrier that blocks electrons introduced from the source region 104 are formed, electrons supplied from the source region 104 over the potential barrier may be accumulated in a potential well near the drain region 101, and thus the height of the potential well at this position may be reduced.

Here, the potential well near the drain region 101 may refer to a potential well in the first channel region 102.

The lowered potential barrier may allow inflow of holes from the drain region, and the holes that cross the barrier may be accumulated in the potential well in the first channel region 102 below the gate region 105 to further lower the potential well.

Accordingly, inflow of additional electrons is possible without additional application of voltage, and the same phenomenon is repeated for a short time, and two potential barriers formed inside the channel region disappear, which is considered a positive feedback loop operation.

According to such a feedback mechanism, the silicon transistor 100 may achieve ideal switching characteristics and may allow high drain current to flow and may be operated while electrons and holes are accumulated in a channel region, and accordingly, the silicon transistor 100 may achieve hysteresis characteristics and may be applied to a volatile memory, a non-volatile memory, or the like.

The aforementioned feedback mechanism of the silicon transistor 100 will be supplementally described below with reference to FIGS. 2C and 2E.

The silicon transistor 100 operating according to a feedback phenomenon may achieve ideal switching characteristics using lower operating voltage than other transistor devices using inter-band tunneling or avalanche breakdown of the drain region 101, the first channel region 102, the second channel region 103, and the source region 104, and thus it may be deemed that the silicon transistor 100 has excellent electrical properties.

It is possible to adjust hysteresis depending on the state of a potential barrier, and thus the silicon transistor 100 may be applied to volatile and non-volatile memories.

In other words, in the silicon transistor 100, a potential barrier that restricts inflow of electrons and holes into a channel region including the first channel region 102 and the second channel region 103 may be formed, and a feedback phenomenon may be induced inside the channel region by controlling the potential barrier through a level of a gate voltage applied through the gate region 105, and thus the silicon transistor 100 may achieve hysteresis characteristics using electrons and holes present in the channel region as well as rapid switching characteristics due to the induced feedback phenomenon, and accordingly, may be applied to a volatile memory and a non-volatile memory, thereby achieving very high usefulness.

FIG. 1B is a diagram showing an example of a scanning electron microscope (SEM) image of a silicon transistor used in a reconfigurable logic-in-memory device according to an embodiment of the present disclosure.

Referring to FIG. 1B, a silicon transistor 110 according to an embodiment of the present disclosure may include a drain region 111, a first channel region 112, a second channel region 113, a source region 114, and a gate region 115.

For example, the drain region 111, the first channel region 112, the second channel region 113, and the source region 114 may configure a p-n-p-n diode structure.

The silicon transistor 110 may be configured in such a way that the polysilicon gate region 115 is formed on or around the first channel region 112 of the p-n-p-n diode structure.

For example, the gate region 115 may be formed to surround the first channel region 112.

For example, when the silicon transistor 110 includes a circuit with CMOS logic, the silicon transistor 110 may perform a logic operation and may also perform a memory logic function due to memory characteristics generated based on a positive feedback loop.

The silicon transistor 110 may support a memory device to variably perform a logic operation as it is possible to adjust the height of a potential barrier depending on a level of a gate voltage applied to the gate region 115.

FIGS. 2A to 2E are diagrams for explaining the reconfigurable switching characteristics of a silicon transistor used in a reconfigurable logic-in-memory device according to an embodiment of the present disclosure.

Figure 2A:
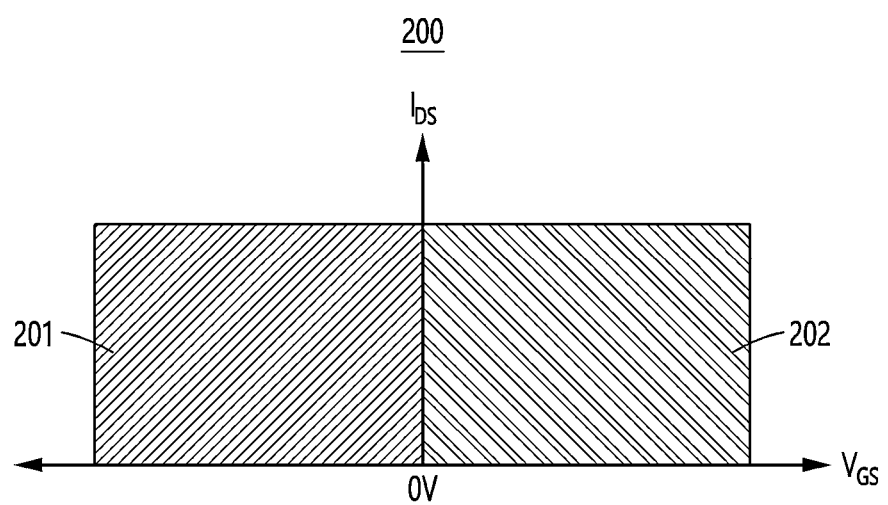
FIGS. 2A to 2E are diagrams for explaining the reconfigurable switching characteristics of a silicon transistor used in a reconfigurable logic-in-memory device according to an embodiment of the present disclosure.

FIG. 2A is a diagram showing an example a domain of the reconfigurable switching characteristics of a silicon transistor used in a reconfigurable logic-in-memory device according to an embodiment of the present disclosure.

Referring to FIG. 2A, a graph 200 classifies channel operations of a silicon transistor according to a high level and a low level based on a zero level of a gate voltage.

Referring to the graph 200, when a level of an applied gate voltage $V_{GS}$ of a silicon transistor is a low level, a second channel operation 201 may be performed, and when a level of the applied gate voltage $V_{GS}$ is a high level, a first channel operation 202 may be performed.

For example, the first channel operation 202 may be referred to as an n-channel operation related to the first channel region, and the second channel operation 201 may be referred to as a p-channel operation related to the second channel region.

Figure 2B:
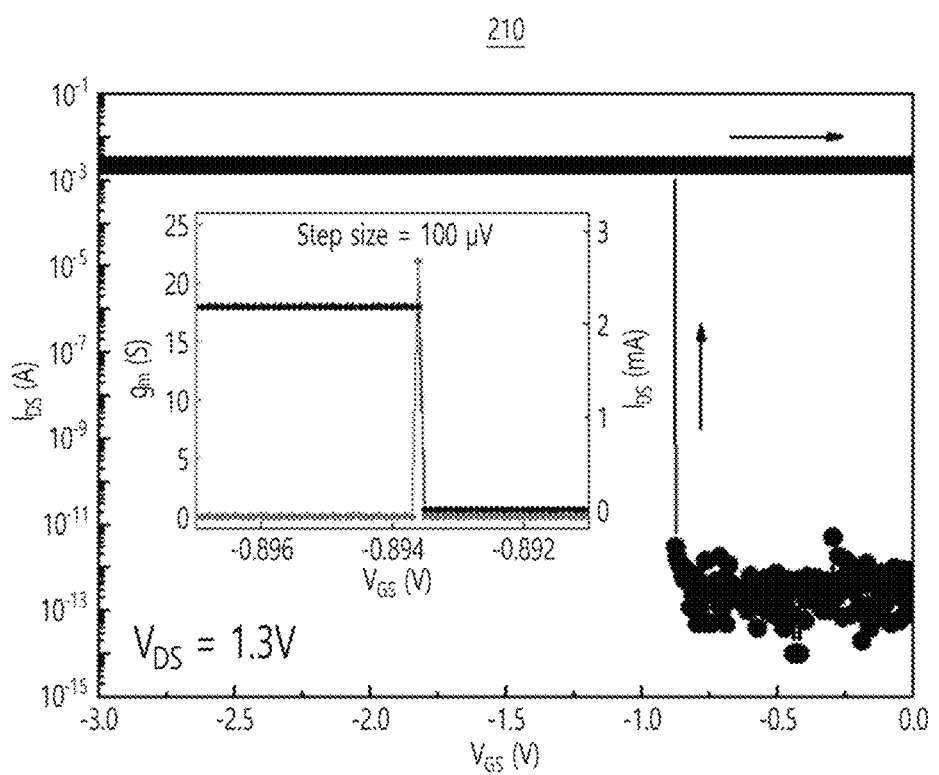
Figure 2C:
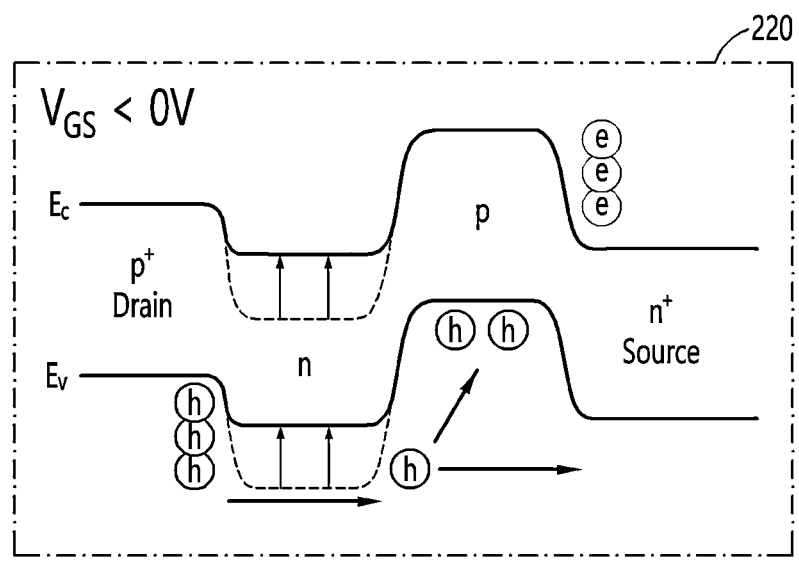
Figure 2C:
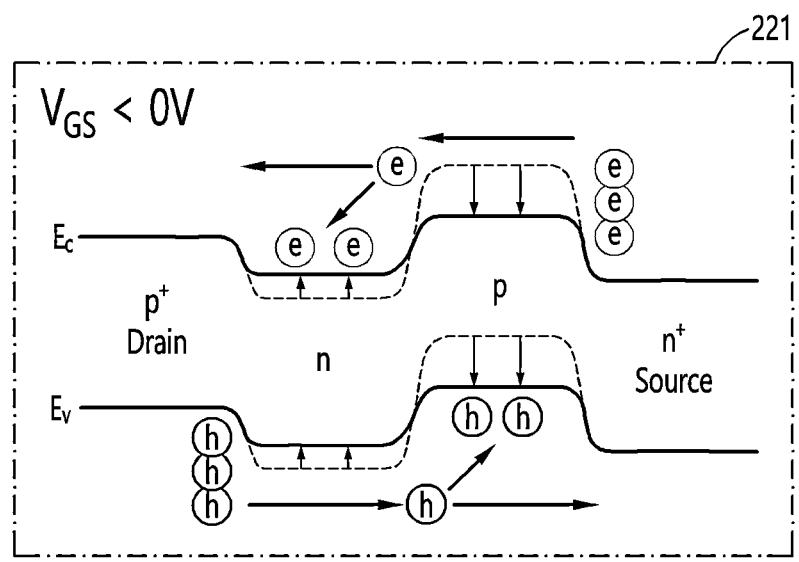

FIGS. 2B and 2C are diagrams for explaining the characteristics of a p-channel operation of a silicon transistor used in a reconfigurable logic-in-memory device according to an embodiment of the present disclosure.

A graph 210 of FIG. 2B shows an example of the case in which a negative voltage equal to or less than 0 V corresponding to a zero level is applied as a gate voltage applied to a gate region of a silicon transistor used in a reconfigurable logic-in-memory device according to an embodiment of the present disclosure.

Referring to the graph 210 of FIG. 2B, the silicon transistor according to an embodiment of the present disclosure may be turned on in a p-channel operation state when a negative voltage is applied as a gate voltage.

For example, the silicon transistor according to an embodiment of the present disclosure may be turned on in a p-channel operation state when a gate voltage of about −0.894 V is applied.

For example, the p-channel operation may be related to an operation in which current flows to a second channel region from a first channel region in a channel region of the silicon transistor.

As seen from the graph 210, when the silicon transistor is turned on, the silicon transistor may be maintained to be turned on through a double sweep mode despite backward sweep.

FIG. 2C is a set of energy band diagrams of a silicon transistor when a negative voltage equal to or less than 0 V corresponding to a zero level is applied as a gate voltage applied to a gate region of a silicon transistor used in a reconfigurable logic-in-memory device according to an embodiment of the present disclosure.

Referring to FIG. 2C, an energy band diagram 220 shows characteristics whereby a potential barrier is reduced in a first channel region and it is possible to inject holes from a drain region along with reduction in the potential barrier when a gate voltage applied to the gate region of the silicon transistor is at a low level.

An energy band diagram 221 shows the case in which a potential barrier is reduced in a first channel region and then holes are injected into a second channel region from a drain region, and accordingly, a positive feedback loop is formed while the potential barrier in the second channel region is reduced and electrons are injected from the source region.

Here, the positive feedback loop may be a second positive feedback loop in which a hole is a majority carrier as holes from a drain region are injected while a potential barrier in the first channel region is reduced.

For example, the silicon transistor may perform the second channel operation while forming a second positive feedback loop in which a hole is a majority carrier in the first channel region and the second channel region as a level of a gate voltage $V_{in}$ applied through a gate region is a low level.

For example, the silicon transistor may perform the second channel operation while forming a second positive feedback loop in which a hole is a majority carrier.

Figure 2D:
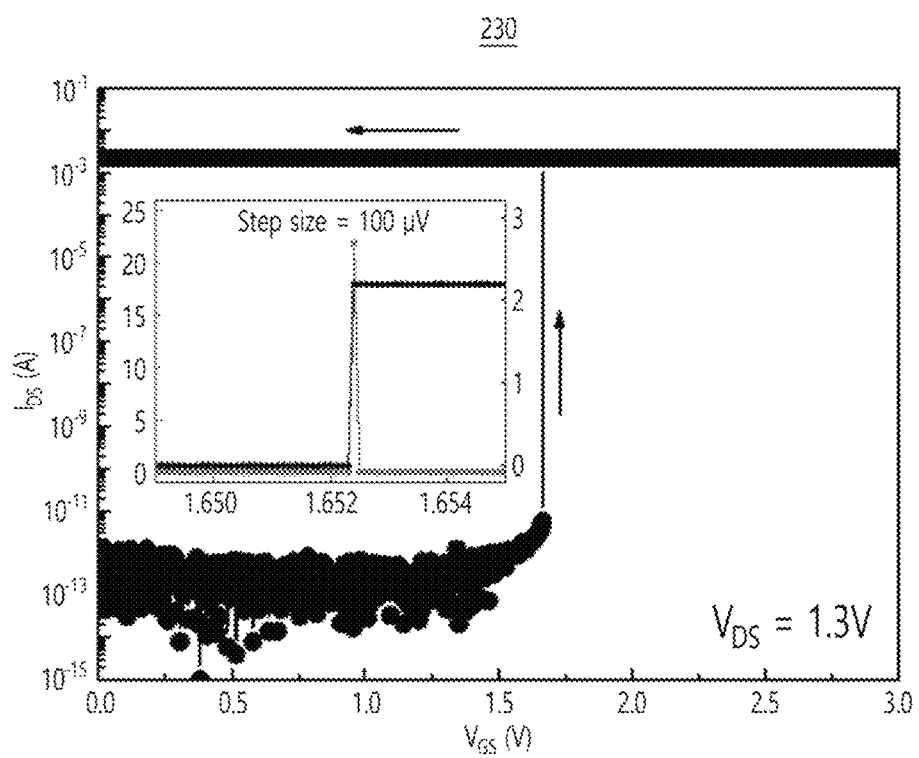
Figure 2E:
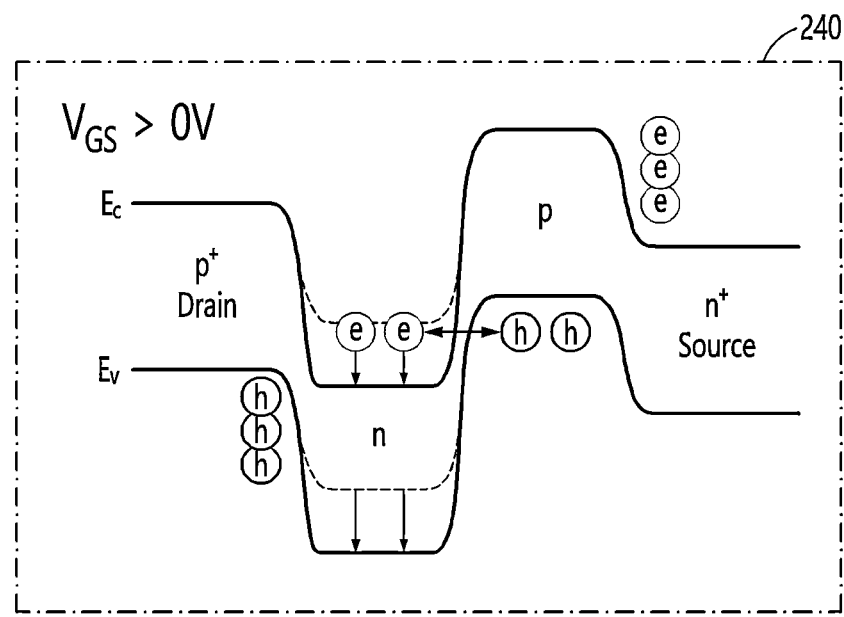
Figure 2E:
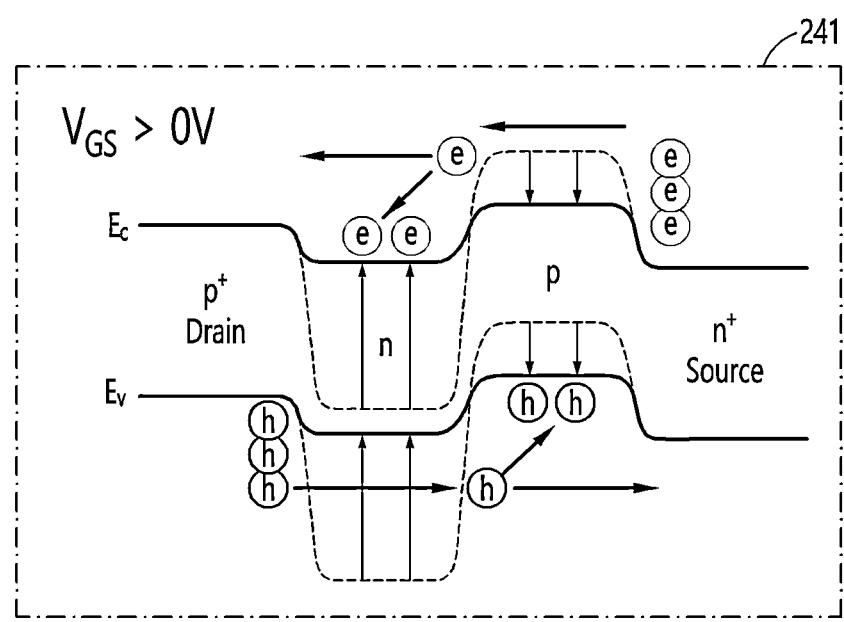

FIGS. 2D and 2E are diagrams for explaining n-channel operation characteristics of a silicon transistor used in a reconfigurable logic-in-memory device according to an embodiment of the present disclosure.

A graph 230 of FIG. 2D shows an example of the case in which a positive voltage equal to or greater than 0 V corresponding to a zero level is applied as a gate voltage applied to a gate region of a silicon transistor used in a reconfigurable logic-in-memory device according to an embodiment of the present disclosure.

Referring to the graph 230 of FIG. 2D, the silicon transistor according to an embodiment of the present disclosure may be turned on in an n-channel operation state when a positive voltage is applied as a gate voltage.

For example, the silicon transistor according to an embodiment of the present disclosure may be turned on in an n-channel operation state when a gate voltage of about 1.652 V is applied.

FIG. 2E is a set of energy band diagrams of a silicon transistor when a positive voltage equal to or greater than 0 V corresponding to a zero level is applied as a gate voltage applied to a gate region of a silicon transistor used in a reconfigurable logic-in-memory device according to an embodiment of the present disclosure.

Referring to FIG. 2E, an energy band diagram 240 shows characteristics whereby a potential barrier is increased in a first channel region and holes from a drain region are prevented from being injected along with increase in the potential barrier when a gate voltage applied to the gate region of the silicon transistor is at a high level.

An energy band diagram 241 shows the case in which a potential barrier is increased in a first channel region and then holes from the drain region are not injected into a first channel region and a second channel region, and accordingly, the device may be turned on as a positive feedback loop in which an electron is a majority carrier is formed while electrons are injected from a source region.

Here, the positive feedback loop may be a first positive feedback loop in which an electron is a majority carrier as holes from a drain region are prevented from being injected while the height of a potential barrier is increased in the first channel region.

For example, the silicon transistor may perform the first channel operation while forming a first positive feedback loop in which an electron is a majority carrier in the first channel region and the second channel region as a level of the gate voltage $V_{in}$ applied through a gate region is a high level.

For example, the silicon transistor may perform the first channel operation while forming a first positive feedback loop in which an electron is a majority carrier.

That is, the silicon transistor may be a device in which a first positive feedback loop or a second positive feedback loop is formed depending on a level of a gate voltage applied to a gate region and that variably performs a first channel operation or a second channel operation.

The silicon transistor may be turned on while charge carriers are accumulated in a potential well of a channel region and a positive feedback loop is formed and may also have memory characteristics.

As seen from the graph 230, when the silicon transistor is turned on, the silicon transistor may be maintained to be turned on through a double sweep mode despite backward sweep.

Figure 3A:
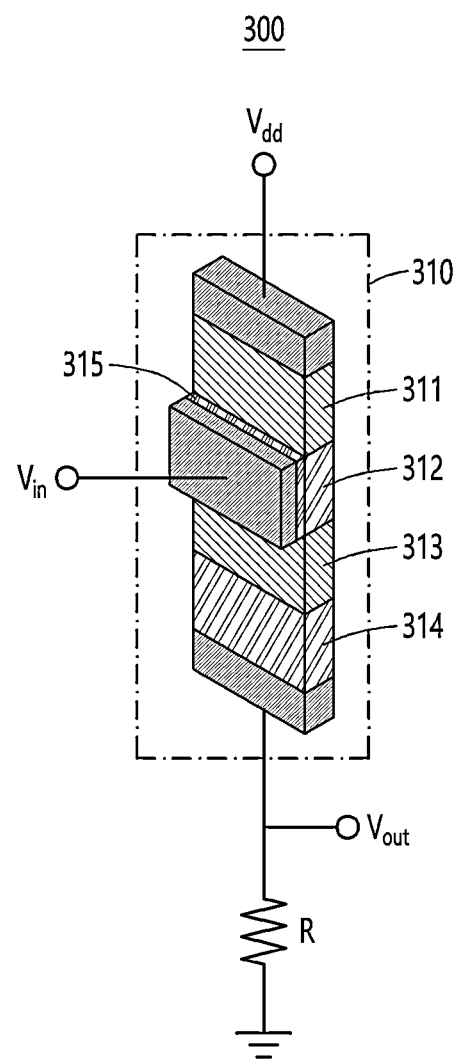
FIG. 3A is a diagram for explaining a reconfigurable logic-in-memory device using one silicon transistor according to an embodiment of the present disclosure.

FIG. 3A is a diagram for explaining a reconfigurable logic-in-memory device using one silicon transistor according to an embodiment of the present disclosure.

Referring to FIG. 3A, a reconfigurable logic-in-memory device 300 using one silicon transistor according to an embodiment of the present disclosure may have a circuit configuration in which a load resistor R is connected in series to a silicon transistor 310.

For example, the silicon transistor 310 may include a diode structure including a drain region 311, a first channel region 312, a second channel region 313, and a source region 314, and a gate region 315 formed in the first channel region 312.

According to an embodiment of the present disclosure, the reconfigurable logic-in-memory device 300 may be configured in such a way that a gate voltage $V_{in}$ is applied to the gate region 315 of the silicon transistor 310, a drain voltage $V_{dd}$ is applied to the drain region 311, and an output voltage $V_{out}$ output through the source region 314 is measured.

For example, the reconfigurable logic-in-memory device 300 may perform a first channel operation or a second channel operation depending on a level of the gate voltage $V_{in}$.

For example, when the gate voltage $V_{in}$ is applied at a low level, the reconfigurable logic-in-memory device 300 may achieve inverter characteristics.

For example, the case in which a level of the gate voltage $V_{in}$ is a low level may correspond to a negative voltage less than 0 V, a zero level may correspond to a state in which a voltage is not applied, and the case of a high level may correspond to a positive voltage greater than 0 V.

That is, the reconfigurable logic-in-memory device 300 may perform a second channel operation when a level of the gate voltage $V_{in}$ is a low level, and the reconfigurable logic-in-memory device 300 may perform a first channel operation when the level of the gate voltage $V_{in}$ is a high level.

For example, the first channel operation may correspond to the n-channel operation, and the second channel operation may correspond to the p-channel operation.

According to an embodiment of the present disclosure, the reconfigurable logic-in-memory device 300 may provide different logic gate functions based on a first channel operation state or a second channel operation state.

Thus, the present disclosure may implement a reconfigurable logic-in-memory device that performs both a reconfigurable logic computing function and a memory function that are controlled according to an electrical signal using a silicon transistor.

In addition, the present disclosure may implement a reconfigurable logic-in-memory device using a silicon transistor having reconfigurable switching characteristics and memory characteristics using which it is possible to use a complementary metal-oxide semiconductor (CMOS) process.

Figure 3B:
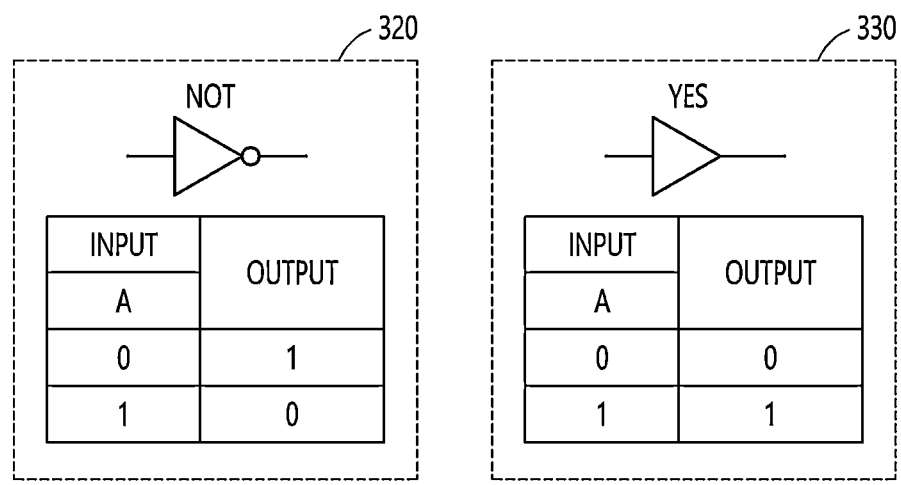
FIG. 3B is a diagram for explaining reconfigurable logic gate characteristics of a reconfigurable logic-in-memory device using one silicon transistor according to an embodiment of the present disclosure.

FIG. 3B is a diagram for explaining reconfigurable logic gate characteristics of a reconfigurable logic-in-memory device using one silicon transistor according to an embodiment of the present disclosure.

FIG. 3B shows an example of reconfigurable logic gate characteristics of a reconfigurable logic-in-memory device using one silicon transistor depending on a first channel operation state and a second channel operation state according to an embodiment of the present disclosure.

FIG. 3B shows an example of first logic gate characteristics 330 and second logic gate characteristics 320.

The first logic gate characteristics 330 may be related to a first channel operation of a silicon transistor and may correspond to YES logic gate characteristics, and INPUT and OUTPUT may be the same.

The second logic gate characteristics 320 may be related to a second channel operation of the silicon transistor and may correspond to NOT logic gate characteristics, and INPUT and OUTPUT may be opposite.

Figure 4A:
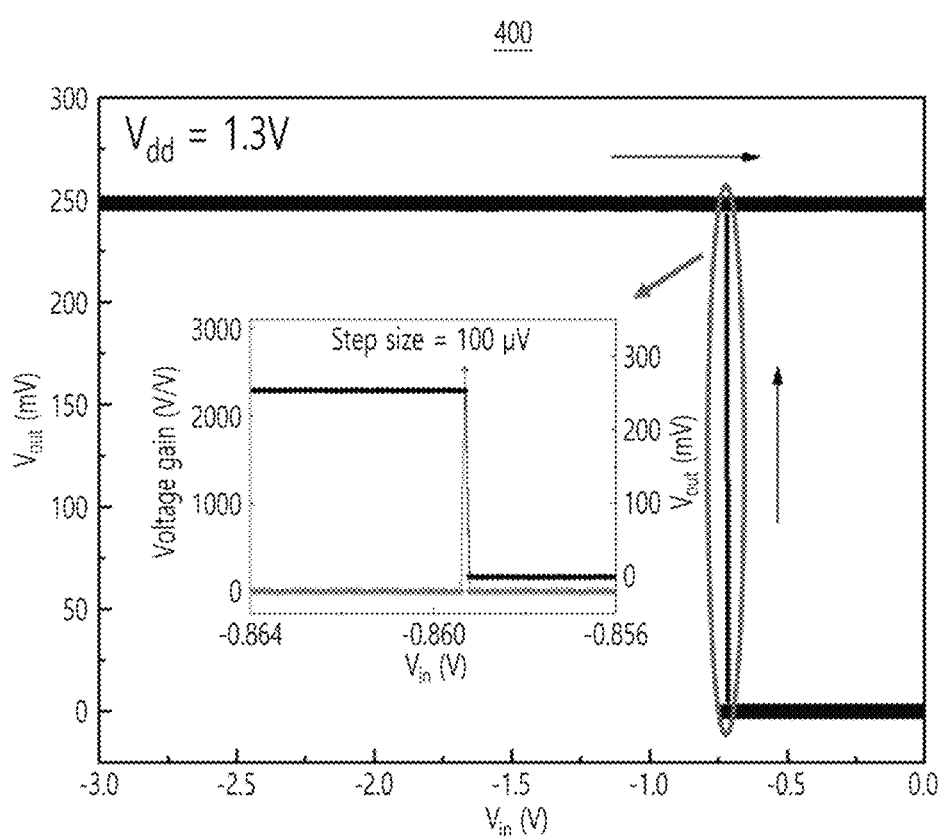
FIGS. 4A and 4B are diagram for explaining the NOT gate characteristics of a reconfigurable logic-in-memory device using one silicon transistor according to an embodiment of the present disclosure.
Figure 4B:
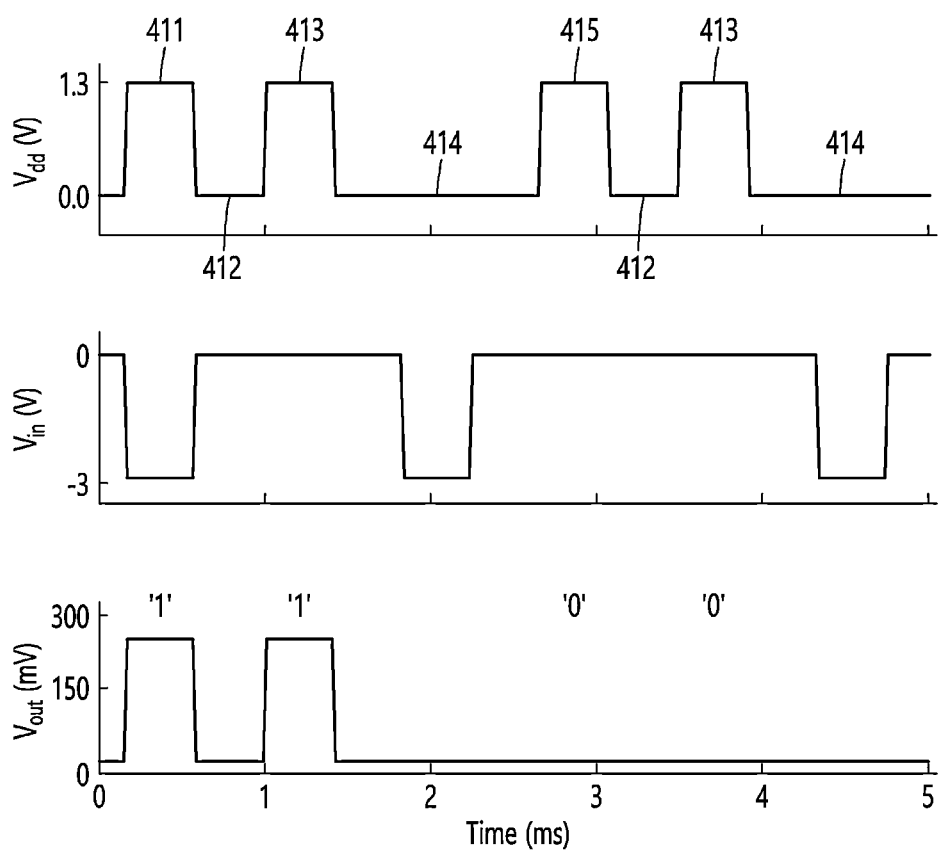

FIGS. 4A and 4B are diagram for explaining the NOT gate characteristics of a reconfigurable logic-in-memory device using one silicon transistor according to an embodiment of the present disclosure.

FIGS. 4A and 4B show an example of transient characteristics related to second logic gate characteristics of a reconfigurable logic-in-memory device according to an embodiment of the present disclosure. For example, the second logic gate characteristics may correspond to NOT gate characteristics.

As seen from a graph 400 of FIG. 4A, the reconfigurable logic-in-memory device according to an embodiment of the present disclosure may have a high voltage gain at a voltage transfer curve (VTC).

Memory characteristics due to a positive feedback loop of a silicon transistor may be checked through double sweep.

FIG. 4B is a diagram showing an example of an operating timing diagram related to second logic gate characteristics of a reconfigurable logic-in-memory device according to an embodiment of the present disclosure.

Referring to FIG. 4B, a timing diagram 410 shows an example of second logic gate characteristics of a reconfigurable logic-in-memory device through an output voltage $V_{out}$ depending on a drain voltage $V_{dd}$ and a gate voltage $V_{in}$ that are applied to a silicon transistor.

In the timing diagram 410, the drain voltage $V_{dd}$ may be differently applied in the form of input 411, standby 412, read 413, reset 414, and input 415 depending on a type thereof. Here, the input 411 may be "0" and the input 415 may be "1".

The input 411 may be an input voltage when the type of the drain voltage $V_{dd}$ is an input voltage in a low state, and the input 415 may be an input voltage when the type of the drain voltage $V_{dd}$ is an input voltage in a high state.

For example, as the output voltage $V_{out}$ is output at a zero level if the type of the drain voltage $V_{dd}$ is an input voltage in a high state, and the output voltage $V_{out}$ is output at a high level if the type of the drain voltage $V_{dd}$ is an input voltage in a low state, the reconfigurable logic-in-memory device using a silicon transistor may perform a logic operation function with a second logic gate based on a level of the output voltage $V_{out}$ when the silicon transistor performs a second channel operation.

In addition, the reconfigurable logic-in-memory device using a silicon transistor may perform a memory function of conversion into an initial state to output a level of the output voltage $V_{out}$, to which a logic operation state that is pre-determined by an input voltage is applied, when the type of the drain voltage $V_{dd}$ is a read operating voltage, and to output the output voltage $V_{out}$, to which the pre-determined logic operation state is applied, at a zero level when the type of the drain voltage $V_{dd}$ is a reset operating voltage when the silicon transistor performs a second channel operation.

The reconfigurable logic-in-memory device using a silicon transistor may check a previous logic operating state as a voltage of the read 413 of the type of the drain voltage $V_{dd}$ is applied.

The reset 414 of the drain voltage $V_{dd}$ may be for a next logic operation by converting the current state into an initial state via recombination of charge carriers accumulated in a channel region of the silicon transistor by the reconfigurable logic-in-memory device using the silicon transistor.

For example, depending on the type of the drain voltage $V_{dd}$, the input 411, the read 413, and the input 415 may correspond to 1.3 V, and the standby 412 and the reset 414 may correspond to 0 V among the input 411, the standby 412, the read 413, the reset 414, and the input 415.

As seen from the timing diagram 410, the output voltage $V_{out}$ opposite to the input 411 and the input 415 of the type of the drain voltage $V_{dd}$ may be detected.

That is, the reconfigurable logic-in-memory device using a silicon transistor may perform a logic operation function with a NOT logic gate, and as the drain voltage $V_{dd}$ is differently applied in the form of the standby 412, the read 413, and the reset 414, the reconfigurable logic-in-memory device may also perform a memory function.

Figure 5A:
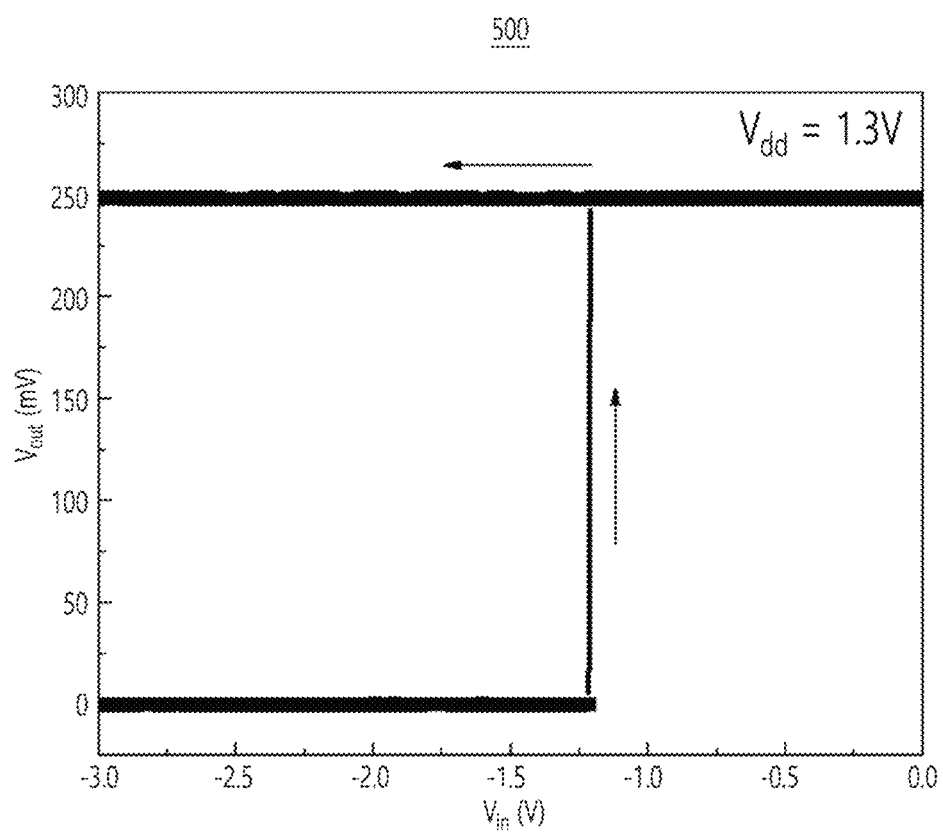
FIGS. 5A and 5B are diagrams for explaining YES gate characteristics of a reconfigurable logic-in-memory device using one silicon transistor according to an embodiment of the present disclosure.
Figure 5B:
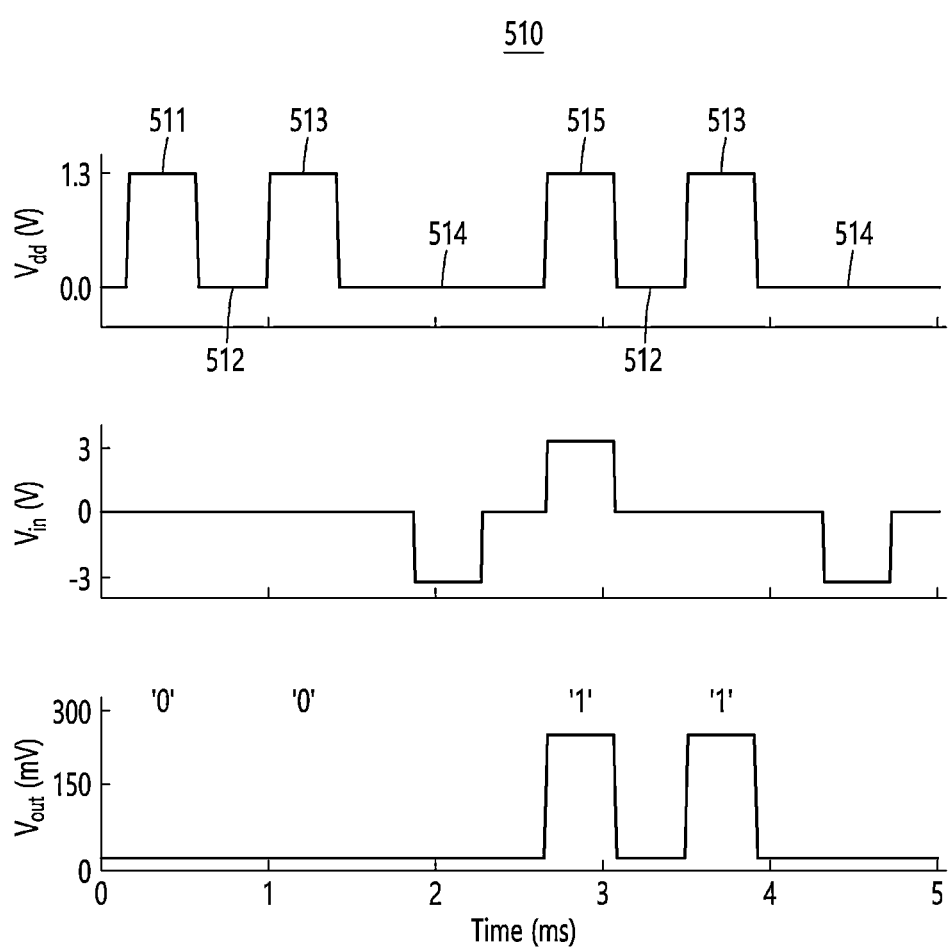

FIGS. 5A and 5B are diagrams for explaining YES gate characteristics of a reconfigurable logic-in-memory device using one silicon transistor according to an embodiment of the present disclosure.

FIGS. 5A and 5B show an example of transient characteristics related to first logic gate characteristics of a reconfigurable logic-in-memory device according to an embodiment of the present disclosure. For example, the first logic gate characteristics may correspond to the YES gate characteristics.

As seen from a graph 500 of FIG. 5A, the reconfigurable logic-in-memory device according to an embodiment of the present disclosure may have a high voltage gain at a voltage transfer curve (VTC).

Memory characteristics due to a positive feedback loop of a silicon transistor may be checked through double sweep.

FIG. 5B is an operating timing diagram related to first logic gate characteristics of a reconfigurable logic-in-memory device according to an embodiment of the present disclosure.

Referring to FIG. 5B, a timing diagram 510 shows an example of first logic gate characteristics of a reconfigurable logic-in-memory device through the output voltage $V_{out}$ depending on the drain voltage $V_{dd}$ and the gate voltage $V_{in}$ that are applied to the silicon transistor.

In the timing diagram 510, the drain voltage $V_{dd}$ may be differently applied in the form of input 511, standby 512, the read 513, the reset 514, and the input 515 depending on a type thereof. Here, the input 511 may correspond to "0" and the input 515 may correspond to "1".

The input 511 may be an input voltage when the type of the drain voltage $V_{dd}$ is an input voltage in a low state, and the input 515 may be an input voltage when the type of the drain voltage $V_{dd}$ is an input voltage in a high state.

For example, as the output voltage $V_{out}$ is output at a high level if the type of the drain voltage $V_{dd}$ is an input voltage in a high state, and the output voltage $V_{out}$ is output at a zero level if the type of the drain voltage $V_{dd}$ is an input voltage in a low state, the reconfigurable logic-in-memory device using a silicon transistor may perform a logic operation function with a first logic gate based on a level of the output voltage $V_{out}$ when the silicon transistor performs a first channel operation.

In addition, the reconfigurable logic-in-memory device using a silicon transistor may perform a memory function of conversion into an initial state to output a level of the output voltage $V_{out}$, to which a logic operation state that is pre-determined by an input voltage is applied, when the type of the drain voltage $V_{dd}$ is a read operating voltage, and to output the output voltage $V_{out}$, to which the pre-determined logic operation state is applied, at a zero level when the type of the drain voltage $V_{dd}$ is a reset operating voltage when the silicon transistor performs a first channel operation.

The reconfigurable logic-in-memory device using a silicon transistor may check a previous logic operating state as a voltage of the read 513 of the type of the drain voltage $V_{dd}$ is applied.

The reset 514 of the drain voltage $V_{dd}$ may be for a next logic operation by converting the current state into an initial state via recombination of charge carriers accumulated in a channel region of the silicon transistor by the reconfigurable logic-in-memory device using the silicon transistor.

For example, depending on the type of the drain voltage $V_{dd}$, the input 511, the read 513, and the input 515 may correspond to 1.3 V, and the standby 512 and the reset 514 may correspond to 0 V among the input 511, the standby 512, the read 513, the reset 514, and the input 515.

As seen from the timing diagram 510, the output voltage $V_{out}$ in the same logic state as the input 511 and the input 515 of the type of the drain voltage $V_{dd}$ may be detected.

That is, the reconfigurable logic-in-memory device using a silicon transistor may perform a logic operation function with a YES logic gate, and as the drain voltage $V_{dd}$ is differently applied in the form of the standby 512, the read 513, and the reset 514, the reconfigurable logic-in-memory device using a silicon transistor may also perform a memory function.

Figure 6A:
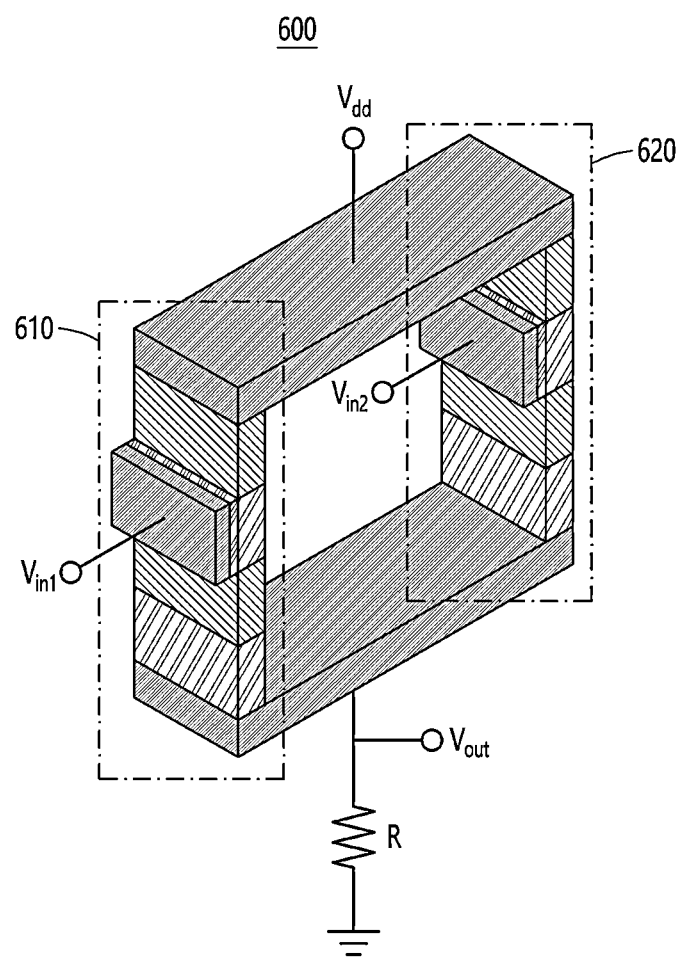
FIG. 6A is a diagram for explaining a reconfigurable logic-in-memory device using two silicon transistors according to an embodiment of the present disclosure.

FIG. 6A is a diagram for explaining a reconfigurable logic-in-memory device using two silicon transistors according to an embodiment of the present disclosure.

Referring to FIG. 6A, a reconfigurable logic-in-memory device 600 using two silicon transistors according to an embodiment of the present disclosure may have a configuration in which a first silicon transistor 610 and a second silicon transistor 620 are connected in parallel to each other and a load resistor R is connected in series thereto.

For example, the first silicon transistor 610 and the second silicon transistor 620 may include a diode structure including a drain region, a first channel region, a second channel region, and a source region, and a gate region formed in the first channel region.

According to an embodiment of the present disclosure, the reconfigurable logic-in-memory device 600 may be configured in such a way that a gate voltage $V_{in1}$ is applied to the gate region of the first silicon transistor 610, a gate voltage $V_{in2}$ is applied to the gate region of the second silicon transistor 620, a drain voltage $V_{dd}$ is applied to the drain region, and an output voltage $V_{out}$ output through the source region is measured.

For example, the reconfigurable logic-in-memory device 600 may perform a first channel operation or a second channel operation depending on levels of the gate voltage $V_{in1}$ and the gate voltage $V_{in2}$.

For example, when the gate voltage $V_{in1}$ and the gate voltage $V_{in2}$ are applied at a low level, the reconfigurable logic-in-memory device 600 may achieve inverter characteristics.

For example, the case in which levels of the gate voltage $V_{in1}$ and the gate voltage $V_{in2}$ are a low level may correspond to a negative voltage less than 0 V, a zero level may correspond to a state in which a voltage is not applied, and the case of a high level may correspond to a positive voltage more than 0 V.

That is, the reconfigurable logic-in-memory device 600 may perform a second channel operation when levels of the gate voltage $V_{in1}$ and the gate voltage $V_{in2}$ are a low level, and the reconfigurable logic-in-memory device 600 may perform a first channel operation when levels of the gate voltage $V_{in1}$ and the gate voltage $V_{in2}$ are a high level.

For example, the first channel operation may correspond to the n-channel operation, and the second channel operation may correspond to the p-channel operation.

According to an embodiment of the present disclosure, the reconfigurable logic-in-memory device 600 may provide different logic gate functions based on a first channel operation state or a second channel operation state.

For example, each of the first silicon transistor 610 and the second silicon transistor 620 may perform a first channel operation while forming a first positive feedback loop in which an electron is a majority carrier in a first channel region and a second channel region depending on a level of the gate voltage $V_{in}$ applied through a gate region or may perform a second channel operation while forming a second positive feedback loop in which a hole is a majority carrier in the first channel region and the second channel region depending on the level of the gate voltage $V_{in}$ applied through the gate region.

Here, the gate voltage $V_{in}$ may also be divided into the gate voltage $V_{in1}$ of the first silicon transistor 610 and the gate voltage $V_{in2}$ of the second silicon transistor 620.

According to an embodiment of the present disclosure, the reconfigurable logic-in-memory device 600 may perform a logic operation function and a memory function based on a level of the output voltage $V_{out}$, which is changed depending on the type of the drain voltage $V_{dd}$ applied through a drain region based on any one of the first channel operation and the second channel operation.

Figure 6B:
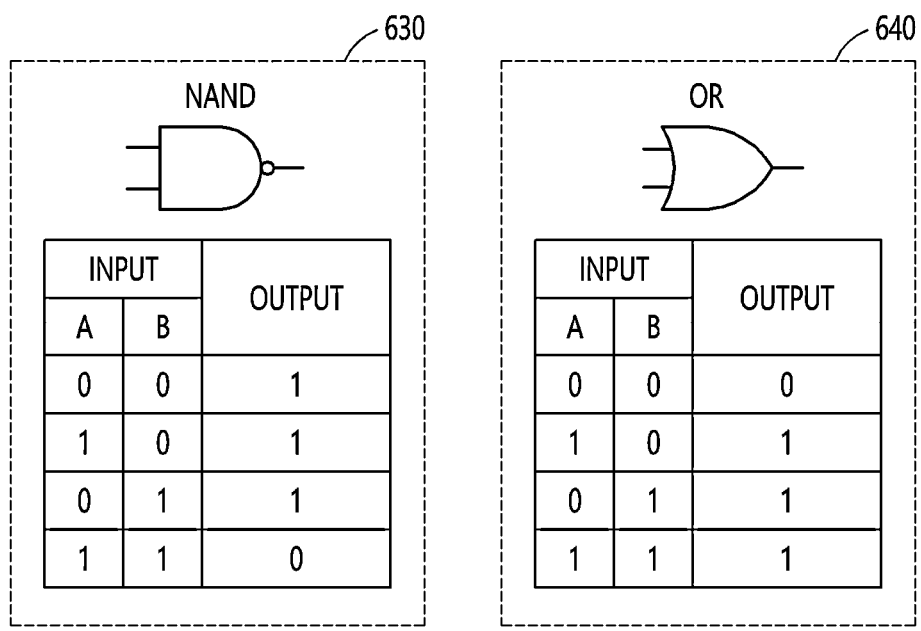
FIG. 6B is a diagram for explaining reconfigurable logic gate characteristics of a reconfigurable logic-in-memory device using two silicon transistors according to an embodiment of the present disclosure.

FIG. 6B is a diagram for explaining reconfigurable logic gate characteristics of a reconfigurable logic-in-memory device using two silicon transistors according to an embodiment of the present disclosure.

FIG. 6B shows an example of reconfigurable logic gate characteristics of a reconfigurable logic-in-memory device using two silicon transistors depending on a first channel operation state and a second channel operation state according to an embodiment of the present disclosure.

FIG. 6B shows an example of third logic gate characteristics 640 and fourth logic gate characteristics 630.

The third logic gate characteristics 640 may be related to first channel operations of first and second silicon transistors and may correspond to OR logic gate characteristics, and when any one of INPUT is in a high state, OUTPUT may indicate a high state.

On the other hand, when all INPUT is in a low state, OUTPUT may indicate a low state.

The fourth logic gate characteristics 630 may be related to second channel operations of first and second silicon transistors and may correspond to NAND logic gate characteristics, and when INPUT has the same logic state, OUTPUT may indicate a high state.

On the other hand, when all INPUT is in a high state, OUTPUT may indicate a low state.

Figure 7A:
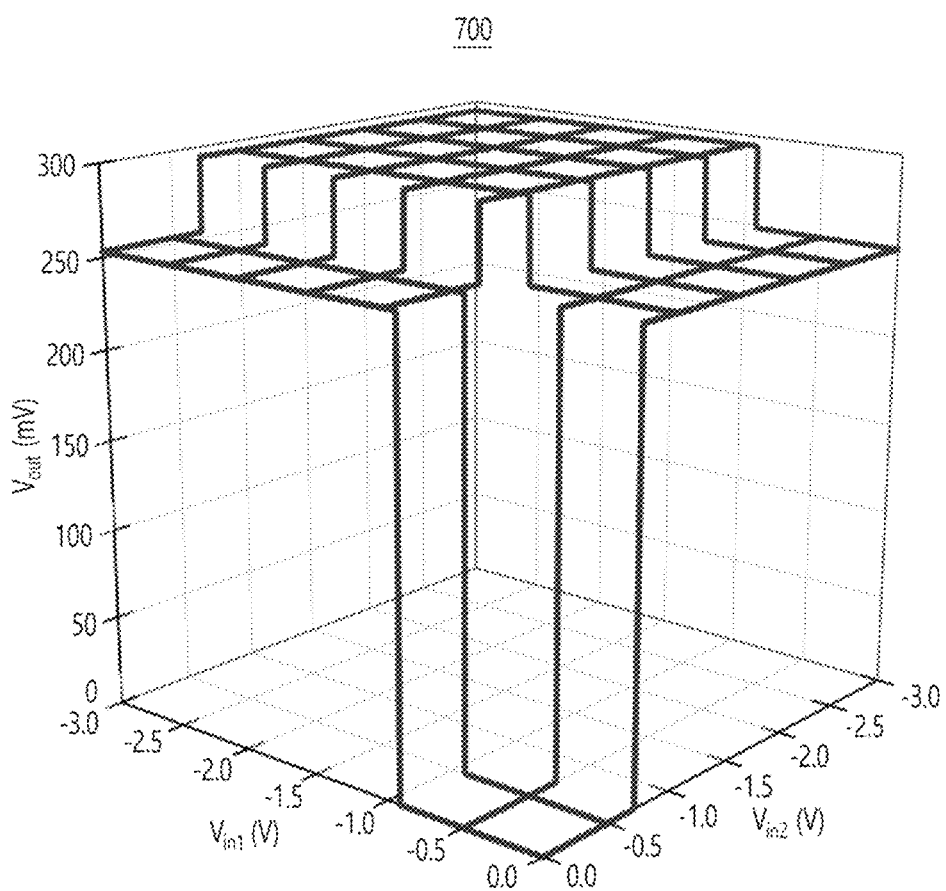
FIGS. 7A and 7B are diagrams for explaining NAND gate characteristics of a reconfigurable logic-in-memory device using two silicon transistors according to an embodiment of the present disclosure.
Figure 7B:
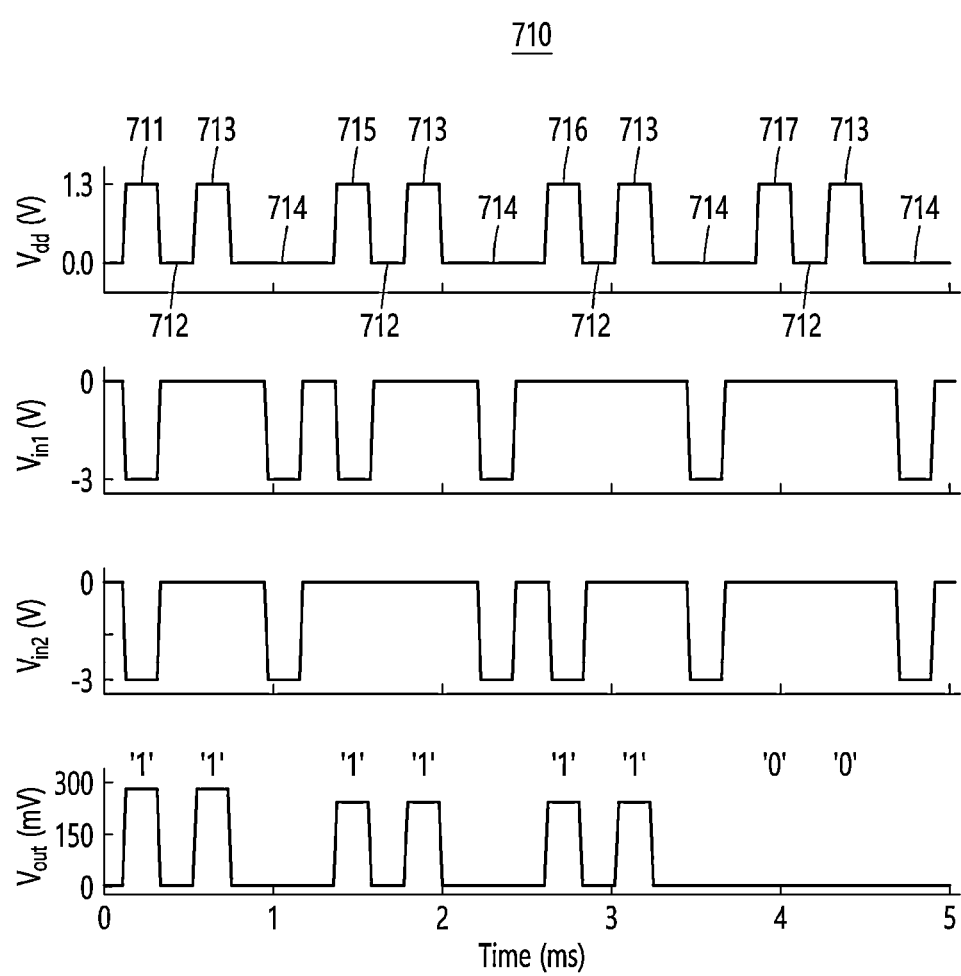

FIGS. 7A and 7B are diagrams for explaining NAND gate characteristics of a reconfigurable logic-in-memory device using two silicon transistors according to an embodiment of the present disclosure.

FIGS. 7A and 7B show an example of transient characteristics related to fourth logic gate characteristics of a reconfigurable logic-in-memory device according to an embodiment of the present disclosure. For example, the fourth logic gate characteristics may correspond to NAND gate characteristics.

As seen from a graph 700 of FIG. 7A, the reconfigurable logic-in-memory device according to an embodiment of the present disclosure may have a high voltage gain at a voltage transfer curve (VTC).

FIG. 7B shows an example of an operating timing diagram related to fourth logic gate characteristics of a reconfigurable logic-in-memory device according to an embodiment of the present disclosure.

Referring to FIG. 7B, a timing diagram 710 shows an example of fourth logic gate characteristics of a reconfigurable logic-in-memory device through an output voltage $V_{out}$ depending on a drain voltage $V_{dd}$ and a gate voltage $V_{in}$, which are applied to a silicon transistor.

In the timing diagram 710, the drain voltage $V_{dd}$ may be differently applied in the form of input 711, standby 712, read 713, reset 714, input 715, input 716, and input 717 depending on a type thereof. Here, the input 711 may correspond to "00", the input 715 may correspond to "01", the input 716 may correspond to "10", and the input 717 may correspond to "11".

The input 711 may be an input voltage when the type of the drain voltage $V_{dd}$ of the first silicon transistor is an input voltage in a low state and may be an input voltage when the type of the drain voltage $V_{dd}$ of the second silicon transistor is an input voltage in a low state, the input 715 may be an input voltage when the type of the drain voltage $V_{dd}$ of the first silicon transistor is an input voltage in a low state and may be an input voltage when the type of the drain voltage $V_{dd}$ of the second silicon transistor is an input voltage in a high state, the input 716 may be an input voltage when the type of the drain voltage $V_{dd}$ of the first silicon transistor is an input voltage in a high state and may be an input voltage when the type of the drain voltage $V_{dd}$ of the second silicon transistor is an input voltage in a low state, and the input 717 may be an input voltage when the type of the drain voltage $V_{dd}$ of the first silicon transistor is an input voltage in a high state and may be an input voltage when the type of the drain voltage $V_{dd}$ of the second silicon transistor is an input voltage in a high state.

That is, a type of input of the drain voltage may be determined depending on a value corresponding to input of the first silicon transistor and a logic state corresponding to input of the second silicon transistor.

Accordingly, the reconfigurable logic-in-memory device using two silicon transistors according to an embodiment of the present disclosure may output the output voltage $V_{out}$ at a high level if the type of the drain voltage $V_{dd}$ of the first silicon transistor is an input voltage in a low state and the type of the drain voltage $V_{dd}$ of the second silicon transistor is an input voltage in a low state, when each of the first and second silicon transistors performs the second channel operation.

The reconfigurable logic-in-memory device may output the output voltage $V_{out}$ at a high level when the type of the drain voltage $V_{dd}$ of the first silicon transistor is an input voltage in a high state and the type of the drain voltage $V_{dd}$ of the second silicon transistor is an input voltage in a low state.

The reconfigurable logic-in-memory device may output the output voltage $V_{out}$ at a high level when the type of the drain voltage $V_{dd}$ of the first silicon transistor is an input voltage in a low state and the type of the drain voltage $V_{dd}$ of the second silicon transistor is an input voltage in a high state.

In addition, the reconfigurable logic-in-memory device may output the output voltage $V_{out}$ at a zero level when the type of the drain voltage $V_{dd}$ of the first silicon transistor is an input voltage in a high state and the type of the drain voltage $V_{dd}$ of the second silicon transistor is an input voltage in a high state, and accordingly, may perform the logic operation function with a fourth logic gate based on the level of the output voltage $V_{out}$. For example, the fourth logic gate may correspond to a NAND gate.

Figure 8A:
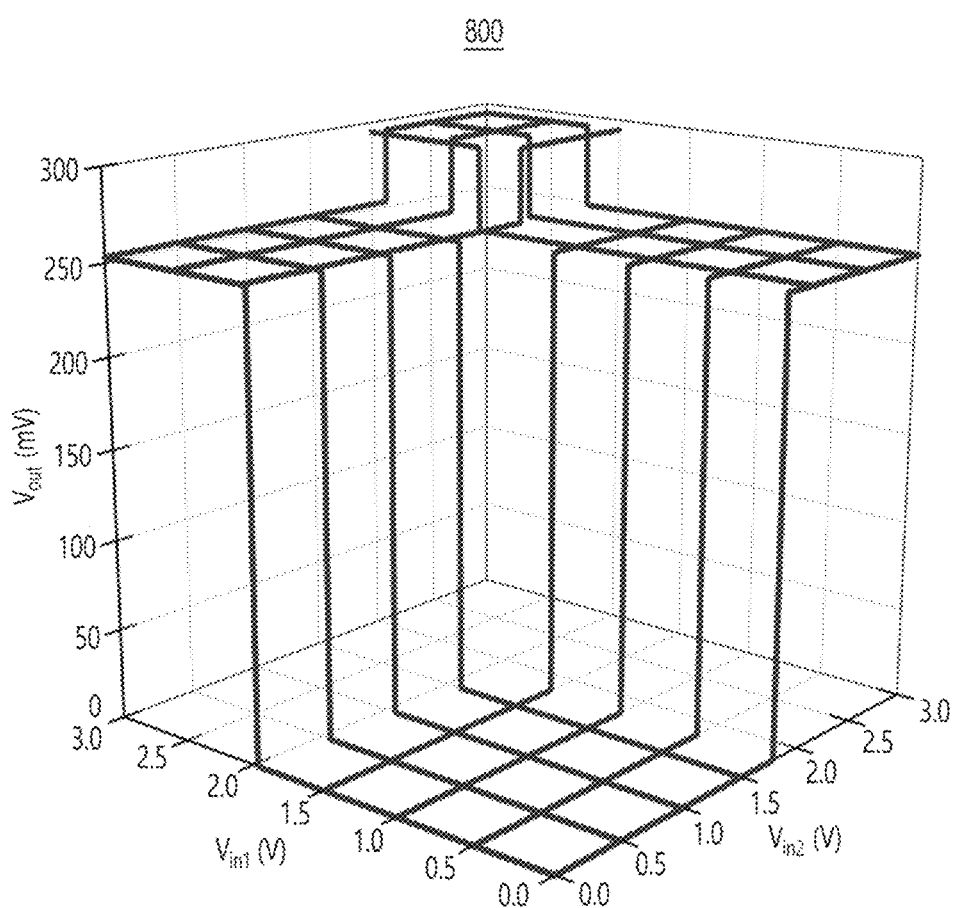
FIGS. 8A and 8B are diagrams for explaining OR gate characteristics of a reconfigurable logic-in-memory device using one silicon transistor according to an embodiment of the present disclosure.
Figure 8B:
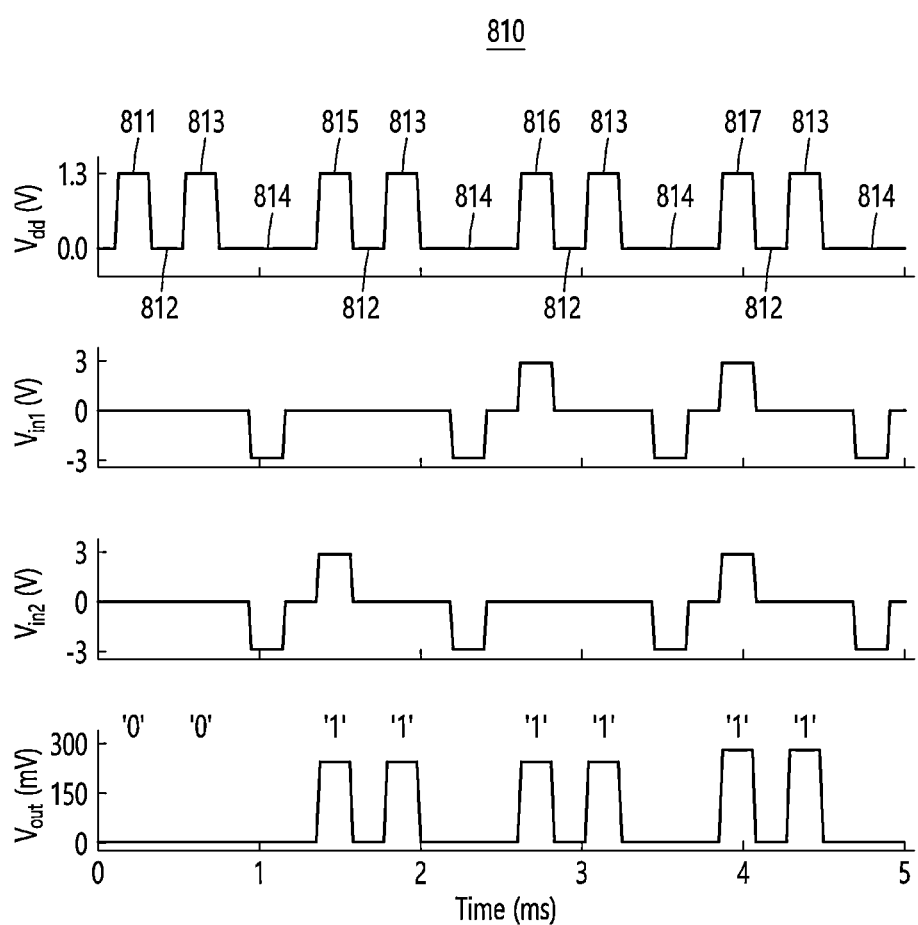

FIGS. 8A and 8B are diagrams for explaining OR gate characteristics of a reconfigurable logic-in-memory device using one silicon transistor according to an embodiment of the present disclosure.

FIGS. 8A and 8B show an example of transient characteristics related to third logic gate characteristics of a reconfigurable logic-in-memory device according to an embodiment of the present disclosure. For example, the third logic gate characteristics may correspond to OR gate characteristics.

As seen from a graph 800 of FIG. 8A, a reconfigurable logic-in-memory device according to an embodiment of the present disclosure has a high voltage gain at a voltage transfer curve (VTC).

FIG. 8B shows an example of an operating timing diagram related to third logic gate characteristics of a reconfigurable logic-in-memory device according to an embodiment of the present disclosure.

Referring to FIG. 8B, a timing diagram 810 shows an example of the third logic gate characteristics of the reconfigurable logic-in-memory device through the output voltage $V_{out}$ based on the drain voltage $V_{dd}$ and the gate voltage $V_{in}$ applied to the silicon transistor.

In the timing diagram 810, the drain voltage $V_{dd}$ may be differently applied in the form of input 811, standby 812, read 813, reset 814, input 815, input 816, and input 817 depending on a type thereof. Here, the input 811 may be "00", the input 815 may be "01", the input 816 may be "10", and the input 817 may be "11".

The input 811 may be an input voltage when the type of the drain voltage $V_{dd}$ of the first silicon transistor is an input voltage in a low state and may be an input voltage when the type of the drain voltage $V_{dd}$ of the second silicon transistor is an input voltage in a low state, the input 815 may be an input voltage when the type of the drain voltage $V_{dd}$ of the first silicon transistor is an input voltage in a low state and may be an input voltage when the type of the drain voltage $V_{dd}$ of the second silicon transistor is an input voltage in a high state, the input 816 may be an input voltage when the type of the drain voltage $V_{dd}$ of the first silicon transistor is an input voltage in a high state and may be an input voltage when the type of the drain voltage $V_{dd}$ of the second silicon transistor is an input voltage in a low state, and the input 817 may be an input voltage when the type of the drain voltage $V_{dd}$ of the first silicon transistor is an input voltage in a high state and may be an input voltage when the type of the drain voltage $V_{dd}$ of the second silicon transistor is an input voltage in a high state.

That is, a type of input of the drain voltage may be determined depending on a value corresponding to input of the first silicon transistor and a logic state corresponding to input of the second silicon transistor.

The reconfigurable logic-in-memory device using two silicon transistors according to an embodiment of the present disclosure may output the output voltage $V_{out}$ at a low level if the type of the drain voltage $V_{dd}$ of the first silicon transistor is an input voltage in a low state and the type of the drain voltage $V_{dd}$ of the second silicon transistor is an input voltage in a low state, when each of the first and second silicon transistors performs the first channel operation.

The reconfigurable logic-in-memory device may output the output voltage $V_{out}$ at a high level when the type of the drain voltage $V_{dd}$ of the first silicon transistor is an input voltage in a high state and the type of the drain voltage $V_{dd}$ of the second silicon transistor is an input voltage in a low state.

The reconfigurable logic-in-memory device may output the output voltage $V_{out}$ at a high level when the type of the drain voltage $V_{dd}$ of the first silicon transistor is an input voltage in a low state and the type of the drain voltage $V_{dd}$ of the second silicon transistor is an input voltage in a high state.

In addition, the reconfigurable logic-in-memory device may output the output voltage $V_{out}$ at a high level when the type of the drain voltage $V_{dd}$ of the first silicon transistor is an input voltage in a high state and the type of the drain voltage $V_{dd}$ of the second silicon transistor is an input voltage in a high state, and accordingly, may perform the logic operation function with a third logic gate based on the level of the output voltage $V_{out}$. For example, the third logic gate may correspond to an OR gate.

When the first silicon transistor and the second silicon transistor equally perform the first channel operation, a memory function for conversion into an initial state may be performed to output a level of the output voltage $V_{out}$, to which a logic operation state that is pre-determined by an input voltage is applied, when the type of the drain voltage $V_{dd}$ is a read operating voltage, and to output the output voltage $V_{out}$, to which the pre-determined logic operation state is applied, at a zero level when the type of the drain voltage $V_{dd}$ is a reset operating voltage.

That is, the reconfigurable logic-in-memory device using two silicon transistors according to an embodiment of the present disclosure may perform a read operation of checking a stored previous logic state, and a reset operation of recombining charge carriers in a channel region for next logic.

In the reconfigurable logic-in-memory device using two silicon transistors, when both silicon transistors are turned on, resistance may be lowered, and thus, as a voltage across a load resistor is increased, an output voltage may be further increased. This includes the possibility of being used as a ternary logic gate.

Accordingly, the reconfigurable logic-in-memory device using a silicon transistor according to the present disclosure may overcome a limit in processing speed and integration due to separation of a memory and a processor.

In addition, the reconfigurable logic-in-memory device using a silicon transistor according to the present disclosure may increase operational efficiency with low power consumption through excellent switching characteristics while reducing standby power using excellent memory characteristics of the silicon transistor.

As apparent from the above description, the present disclosure can implement a reconfigurable logic-in-memory device that performs both a reconfigurable logic computing function and a memory function that are controlled according to an electrical signal using a silicon transistor.

The present disclosure can implement a reconfigurable logic-in-memory device using a silicon transistor having reconfigurable switching characteristics and memory characteristics using which it is possible to use a complementary metal-oxide semiconductor (CMOS) process.

The reconfigurable logic-in-memory device using a silicon transistor according to the present disclosure can overcome a limit in processing speed and integration due to separation of a memory and a processor.

The reconfigurable logic-in-memory device using a silicon transistor according to the present disclosure can increase operational efficiency with low power consumption through excellent switching characteristics while reducing standby power using excellent memory characteristics of the silicon transistor.

In the aforementioned embodiments, constituents of the present disclosure were expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms. In other words, it should be understood that plural constituents may be a singular constituent or a singular constituent may be plural constituents.

While the embodiments of the present disclosure have been described, those skilled in the art will appreciate that many modifications and changes can be made to the present disclosure without departing from the spirit and essential characteristics of the present disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

What is claimed is:

1. A reconfigurable logic-in-memory device using a silicon transistor, comprising:
a silicon transistor including a drain region, a first channel region, a second channel region, a source region, and a gate region,
wherein:
the silicon transistor performs a first channel operation while forming a first positive feedback loop in which an electron is a majority carrier in the first channel region and the second channel region depending on a level of a gate voltage $V_{in}$ applied through the gate region or performs a second channel operation while forming a second positive feedback loop in which a hole is a majority carrier in the first channel region and the second channel region depending on the level of a gate voltage $V_{in}$ applied through the gate region; and
the silicon transistor performs a logic operation function and a memory function based on a level of an output voltage $V_{out}$, which is changed depending on a type of a drain voltage $V_{dd}$ applied through the drain region based on any one channel operation of the first channel operation and the second channel operation.

2. The reconfigurable logic-in-memory device according to claim 1, wherein, when the level of the gate voltage $V_{in}$ is a high level, the silicon transistor performs the first channel operation while forming the first positive feedback loop by preventing a hole from being injected from the drain region as a potential barrier in the first channel region is increased.

3. The reconfigurable logic-in-memory device according to claim 2, wherein, when the silicon transistor performs the first channel operation, the reconfigurable logic-in-memory device performs the logic operation function with a first logic gate based on the level of the output voltage $V_{out}$ as the output voltage $V_{out}$ is output at a high level when the type of the drain voltage $V_{dd}$ is an input voltage in a high state and the output voltage $V_{out}$ is output at a zero level when the type of the drain voltage $V_{dd}$ is an input state in a low state.

4. The reconfigurable logic-in-memory device according to claim 3, wherein, when the silicon transistor performs any one of the first channel operation and the second channel operation, the reconfigurable logic-in-memory device performs the memory function for conversion into an initial state to output a level of the output voltage $V_{out}$, to which a logic operation state pre-determined by the input voltage is applied, when the type of the drain voltage $V_{dd}$ is a read operating voltage and to output the level of the output voltage $V_{out}$, to which the pre-determined logic operation state is applied, at a zero level when the type of the drain voltage $V_{dd}$ is a reset operating voltage.

5. The reconfigurable logic-in-memory device according to claim 1, wherein, when the level of the gate voltage $V_{in}$ is a low level, the silicon transistor performs the second channel operation while forming the second positive feedback loop as a hole is injected from the drain region while a potential barrier in the first channel region is reduced.

6. The reconfigurable logic-in-memory device according to claim 5, wherein, when the silicon transistor performs the second channel operation, the reconfigurable logic-in-memory device performs the logic operation function with a second logic gate based on the level of the output voltage $V_{out}$ as the output voltage $V_{out}$ is output at a zero level when the type of the drain voltage $V_{dd}$ is an input voltage in a high state and the output voltage $V_{out}$ is output at a high level when the type of the drain voltage $V_{dd}$ is an input voltage in a low state.

7. The reconfigurable logic-in-memory device according to claim 1, wherein:
the drain region and the second channel region are in a p-doped state; and
the source region and the first channel region are in an n-doped state.

8. A reconfigurable logic-in-memory device using a silicon transistor, comprising:
a first silicon transistor including a drain region, a first channel region, a second channel region, a source region, and a gate region; and
a second silicon transistor including a drain region, a first channel region, a second channel region, a source region, and a gate region and connected in parallel to the first silicon transistor,
wherein:
each of the first silicon transistor and the second silicon transistor performs a first channel operation while forming a first positive feedback loop in which an electron is a majority carrier in the first channel region and the second channel region depending on a level of a gate voltage $V_{in}$ applied through the gate region or performs a second channel operation while forming a second positive feedback loop in which a hole is a majority carrier in the first channel region and the second channel region depending on the level of a gate voltage $V_{in}$ applied through the gate region; and
each of the first silicon transistor and the second silicon transistor performs a logic operation function and a memory function based on a level of an output voltage $V_{out}$, which is changed depending on a type of a drain voltage $V_{dd}$ applied through the drain region based on any one channel operation of the first channel operation and the second channel operation.

9. The reconfigurable logic-in-memory device according to claim 8, wherein, when the level of the gate voltage $V_{in}$ is a high level, each of the first silicon transistor and the second silicon transistor performs the first channel operation while forming the first positive feedback loop by preventing a hole from being injected from the drain region as a potential barrier in the first channel region is increased.

10. The reconfigurable logic-in-memory device according to claim 9, wherein, when each of the first silicon transistor and the second silicon transistor performs the first channel operation, the reconfigurable logic-in-memory device performs the logic operation function with a third logic gate based on the level of the output voltage $V_{out}$ as the output voltage $V_{out}$ is output at a zero level when the type of the drain voltage $V_{dd}$ of the first silicon transistor is an input voltage in a low state and the type of the drain voltage $V_{dd}$ of the second silicon transistor is an input voltage in a low state, the output voltage $V_{out}$ is output at a high level when the type of the drain voltage $V_{dd}$ of the first silicon transistor is an input voltage in a high state and the type of the drain voltage $V_{dd}$ of the second silicon transistor is an input voltage in a low state, the output voltage $V_{out}$ is output at a high level when the type of the drain voltage $V_{dd}$ of the first silicon transistor is an input voltage in a low state and the type of the drain voltage $V_{dd}$ of the second silicon transistor is an input voltage in a high state, and the output voltage $V_{out}$ is output at a high level when the type of the drain voltage $V_{dd}$ of the first silicon transistor is an input voltage in a high state and the type of the drain voltage $V_{dd}$ of the second silicon transistor is an input voltage in a high state.

11. The reconfigurable logic-in-memory device according to claim 10, wherein, when each of the first silicon transistor and the second silicon transistor equally performs any one of the first channel operation and the second channel operation, the reconfigurable logic-in-memory device performs the memory function for conversion into an initial state to output a level of the output voltage $V_{out}$, to which a logic operation state pre-determined by the input voltage is applied, when the type of the drain voltage $V_{dd}$ is a read operating voltage and to output the level of the output voltage $V_{out}$, to which the pre-determined logic operation state is applied, at a zero level when the type of the drain voltage $V_{dd}$ is a reset operating voltage.

12. The reconfigurable logic-in-memory device according to claim 8, wherein, when the level of the gate voltage $V_{in}$ is a low level, each of the first and second silicon transistors performs the second channel operation while forming the second positive feedback loop as a hole is injected from the drain region while a potential barrier in the first channel region is reduced.

13. The reconfigurable logic-in-memory device according to claim 12, wherein, when each of the first silicon transistor and the second silicon transistor performs the second channel operation, the reconfigurable logic-in-memory device performs the logic operation function with a fourth logic gate based on the level of the output voltage $V_{out}$ as the output voltage $V_{out}$ is output at a high level when the type of the drain voltage $V_{dd}$ of the first silicon transistor is an input voltage in a low state and the type of the drain voltage $V_{dd}$ of the second silicon transistor is an input voltage in a low state, the output voltage $V_{out}$ is output at a high level when the type of the drain voltage $V_{dd}$ of the first silicon transistor is an input voltage in a high state and the type of the drain voltage $V_{dd}$ of the second silicon transistor is an input voltage in a low state, the output voltage $V_{out}$ is output at a high level when the type of the drain voltage $V_{dd}$ of the first silicon transistor is an input voltage in a low state and the type of the drain voltage $V_{dd}$ of the second silicon transistor is an input voltage in a high state, and the output voltage $V_{out}$ is output at a zero level when the type of the drain voltage $V_{dd}$ of the first silicon transistor is an input voltage in a high state and the type of the drain voltage $V_{dd}$ of the second silicon transistor is an input voltage in a high state.

14. The reconfigurable logic-in-memory device according to claim 8, wherein:
in each of the first silicon transistor and the second silicon transistor, the drain region and the second channel region are in a p-doped state; and
the source region and the first channel region are in an n-doped state.

* * * * *